US010468570B2

(12) United States Patent
Liao et al.

(10) Patent No.: US 10,468,570 B2
(45) Date of Patent: Nov. 5, 2019

(54) CIRCUIT BOARD AND METHOD FOR MANUFACTURING THE SAME

(71) Applicant: Unimicron Technology Corp., Taoyuan (TW)

(72) Inventors: Po-Hsuan Liao, Taoyuan (TW); Zong-Hua Li, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/880,561

(22) Filed: Jan. 26, 2018

(65) Prior Publication Data

US 2019/0181315 A1 Jun. 13, 2019

(30) Foreign Application Priority Data

Dec. 11, 2017 (TW) ............................ 106143403 A (51) Int. Cl.
| | |
|---|---|
| *H01L 33/62* | (2010.01) |
| *H01L 23/498* | (2006.01) |
| *H01L 21/48* | (2006.01) |
| *H01L 23/13* | (2006.01) |
| *H01L 33/58* | (2010.01) |
| *H01L 33/52* | (2010.01) |

(52) U.S. Cl.
CPC .......... *H01L 33/62* (2013.01); *H01L 21/4853* (2013.01); *H01L 23/13* (2013.01); *H01L 23/49838* (2013.01); *H01L 23/49894* (2013.01); *H01L 33/52* (2013.01); *H01L 33/58* (2013.01); *H01L 2933/005* (2013.01); *H01L 2933/0058* (2013.01); *H01L 2933/0066* (2013.01)

(58) Field of Classification Search
CPC ....................................................... H01L 33/62
USPC ............................................................ 257/98
See application file for complete search history.

(56) References Cited

U.S. PATENT DOCUMENTS

| | | | |
|---|---|---|---|
| 8,199,306 B2 | 6/2012 | Lee et al. | |
| 9,793,395 B1* | 10/2017 | Liu | ...................... H01L 29/7827 |
| 9,825,032 B1* | 11/2017 | Bentley | ............. H01L 29/41791 |
| 9,954,150 B2* | 4/2018 | Schwarz | ................. H01L 33/54 |
| 2003/0189830 A1* | 10/2003 | Sugimoto | ........... H01L 25/0753 |
| | | | 362/294 |
| 2007/0048901 A1* | 3/2007 | Hwan | .................... H01L 21/561 |
| | | | 438/108 |
| 2012/0170887 A1* | 7/2012 | Yang | ...................... G02B 6/132 |
| | | | 385/14 |

(Continued)

FOREIGN PATENT DOCUMENTS

| | | |
|---|---|---|
| JP | 2001274034 A | 10/2001 |
| TW | 200620720 A | 6/2006 |

(Continued)

*Primary Examiner* — Igwe U Anya
(74) *Attorney, Agent, or Firm* — CKC & Partners Co., LLC (57) ABSTRACT

A circuit board includes a base plate, a first circuit layer, a first dielectric layer, and a light emitting element. The first circuit layer is disposed on the base plate. The first dielectric layer is disposed on the base plate and has plural openings. The first circuit layer is embedded in the first dielectric layer and exposes the openings. A Young's modulus of the first dielectric layer is greater than a Young's modulus of the base plate. The light emitting element is electrically connected to the first circuit layer through the openings.

17 Claims, 4 Drawing Sheets

(56) References Cited

U.S. PATENT DOCUMENTS

| | | | |
|---|---|---|---|
| 2013/0299789 A1* | 11/2013 | Yamazaki | H01L 51/5246 257/40 |
| 2014/0077246 A1* | 3/2014 | Bhat | H01L 33/0079 257/98 |
| 2015/0305154 A1* | 10/2015 | Hayashi | H01L 23/49822 174/260 |
| 2015/0319868 A1* | 11/2015 | Wei | H05K 3/4605 174/255 |
| 2016/0313393 A1* | 10/2016 | Takemura | H05K 1/0268 |
| 2017/0373167 A1* | 12/2017 | Bergendahl | H01L 29/785 |

FOREIGN PATENT DOCUMENTS

| | | |
|---|---|---|
| TW | I391039 B | 3/2013 |
| TW | I576929 B | 4/2017 |

* cited by examiner

CIRCUIT BOARD AND METHOD FOR MANUFACTURING THE SAME

CROSS-REFERENCE TO RELATED APPLICATION

This application claims priority to Taiwan Application Serial Number 106143403 filed Dec. 11, 2017, which is herein incorporated by reference.

BACKGROUND

Field of Invention

The present disclosure relates to a circuit board, and especially relates to a method for manufacturing the circuit board.

Description of Related Art

A circuit board is a part needed for an electronic device such as a mobile phone or a computer, and/or a household appliance such as a television, a washing machine or a refrigerator. In detail, the circuit board is able to carry a variety of electronic components, such as chips, passive components, active components, or a microelectromechanical system (MEMS) thereon. As such, an electric current can be transmitted via the circuit board to the aforementioned electronic components, thereby operating the electronic device and/or the household appliance.

SUMMARY

The present disclosure provides a circuit board. The circuit board includes a base plate, a first circuit layer, a first dielectric layer, and a light emitting element. The first circuit layer is disposed on the base plate. The first dielectric layer is disposed on the base plate and has plural openings. The first circuit layer is embedded in the first dielectric layer and is exposed from the openings. A Young's modulus of the first dielectric layer is greater than a Young's modulus of the base plate. The light emitting element is electrically connected to the first circuit layer through the openings.

In some embodiments of the present disclosure, the first dielectric layer is doped with at least one inorganic material.

In some embodiments of the present disclosure, the inorganic material includes SiO, $SiO_2$, $Al_2O_3$, or combinations thereof.

In some embodiments of the present disclosure, a top surface of the first dielectric layer facing away from the base plate is coplanar with a top surface of the first circuit layer facing away from the base plate.

In some embodiments of the present disclosure, the circuit board further includes a second dielectric layer. The second dielectric layer is disposed on the first dielectric layer and has plural through holes. The through holes are respectively communicated with the openings. The light emitting element is electrically connected to the first circuit layer through the opening and the through holes. The Young's modulus of the first dielectric layer is greater than a Young's modulus of the second dielectric layer.

In some embodiments of the present disclosure, the circuit further includes a second circuit layer. The second circuit layer is partially disposed on the second dielectric layer conformally, and is located in the through holes, and is in contact with the first circuit layer. The light emitting element is electrically connected to the second circuit layer through the through holes.

In some embodiments of the present disclosure, a contour of a vertical projection of the second circuit layer projected on the base plate covers an entirety of a vertical projection of the light emitting element projected on the base plate.

In some embodiments of the present disclosure, the circuit board further includes a spacer. The spacer is located between the first dielectric layer and the light emitting element in a direction perpendicular to the base plate.

In some embodiments of the present disclosure, the circuit board further includes plural conductive contacts. The conductive contacts are located in the through holes respectively. A top surface of the spacer is spaced apart from the base plate by a first distance. Top surfaces of the conductive contacts are spaced apart from the base plate by a second distance. The second distance is less than the first distance.

In some embodiments of the present disclosure, the circuit board further includes a light absorbing structure. The light absorbing structure is disposed on the first dielectric layer, and protrudes away from the base plate, and is located adjacent to the light emitting element.

In some embodiments of the present disclosure, a top surface of the light emitting element is spaced apart from the base plate by a first distance. A top surface of the light absorbing structure is spaced apart from the base plate by a second distance. The second distance is greater than the first distance.

The present disclosure provides a method for manufacturing a circuit board. The method includes forming a first circuit layer on a base plate; forming a first dielectric layer on the base plate, such that the first circuit layer is embedded in the first dielectric layer, in which the first dielectric layer has first openings, and the first circuit layer is exposed from the first openings; and electrically connecting a light emitting element to the exposed first circuit layer to enable the light emitting element to emit light.

In some embodiments of the present disclosure, the operation of forming the first dielectric layer on the base plate is performed by pressing, such that the first circuit layer is embedded in the first dielectric layer.

In some embodiments of the present disclosure, the operation of forming the first dielectric layer on the base plate includes: forming a first dielectric material on the base plate, such that the first dielectric material covers the first circuit layer; and removing a portion of the first dielectric material until the first circuit layer is exposed from the first openings.

In some embodiments of the present disclosure, the operation of removing the portion of the first dielectric material is performed by a grinding process.

In some embodiments of the present disclosure, the operation of removing the portion of the dielectric material until the first circuit layer is exposed from the openings further makes a top surface of the first dielectric layer be coplanar with a top surface of the first circuit layer.

In some embodiments of the present disclosure, the light emitting element is a light emitting diode, and the electrically connecting the light emitting element to the exposed first circuit layer is electrically bonding the light emitting diode to the first circuit layer by performing a flip chip process.

In some embodiments of the present disclosure, the operation of electrically connecting the light emitting element to the exposed first circuit layer further includes: forming a second dielectric material on the first dielectric layer; and patterning the second dielectric material to form plural through holes, such that the first circuit layer is exposed from the through holes, in which the light emitting element is electrically connected to the first circuit layer through the through holes.

In some embodiments of the present disclosure, the operation of electrically connecting a light emitting element to the exposed first circuit layer further includes: forming a spacer on the patterned second dielectric material; and forming a conductive material in the through holes at least until the conductive material is in contact with the spacer to form plural conductive contacts, in which the light emitting element is electrically connected to the first circuit layer through the conductive contacts.

In some embodiments of the present disclosure, the operation of electrically connecting a light emitting element to the exposed first circuit layer further includes: forming a second circuit layer on the patterned second dielectric material conformally before the forming the spacer; and patterning the second circuit layer at least to form a second opening located outside the through holes and exposing the patterned second dielectric layer, in which the spacer is connected to the patterned second dielectric material through the second opening and is electrically isolated from the conductive contacts.

In the aforementioned configurations, the first dielectric layer is able to withstand external environment pressure and temperature without warping, thereby maintaining a flatness of an entirety of the circuit board. Therefore, the first dielectric layer may prevent the first dielectric layer from wrapping and prevent subsequent components formed on the first dielectric layer from being damaged due to inaccurate positioning on the base plate, thereby improving the yield of the circuit board.

In addition, the spacer is able to prevent the conductive contacts from contacting each other, thereby enabling a light emitting device formed subsequently to operate normally. Furthermore, because the spacer of the embodiment is an elastic body, when the light emitting device is disposed on the conductive contacts, the spacer is able to absorb an energy generated by a collision as a buffer structure, so as to prevent the light emitting device from being damaged during the collision in a manufacturing process.

Moreover, in the embodiment, the light absorbing structure surrounds the light emitting device and extends away from the base plate along the second direction. Therefore, the light absorbing structure is able to absorb light emitted laterally by the light emitting device, thereby preventing the circuit board from the problem of light leakage or preventing light emitted from different light emitting devices on the circuit board from mixing with each other.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIGS. 1-14. FIGS. 1-14 are cross-sectional views of a circuit board 1 (labeled in FIG. 14) at various stages of fabrication in accordance with some embodiments of the present disclosure.

Figure 1:
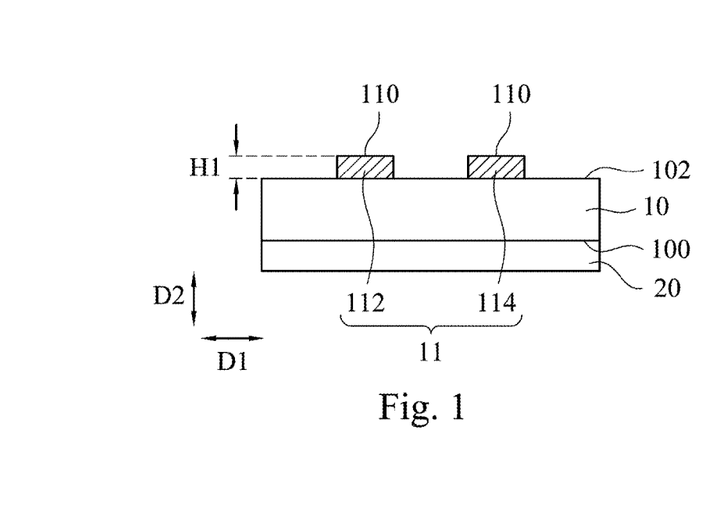
FIGS. 1-14 are cross-sectional views of a circuit board at various stages of fabrication in accordance with some embodiments of the present disclosure.

As shown in FIG. 1, a base plate 10 and a supporting plate 20 are provided. The base plate 10 of the embodiment has a first surface 100 and a second surface 102 opposite, and is formed from a ceramic plate, a metal plate, an organic plate, or any other suitable structure. In the embodiment, a direction parallel to the base plate 10 is defined as a first direction D1, a direction substantially orthogonal to the base plate 10 is defined as a second direction D2, and the second direction D2 is defined as being substantially orthogonal to the first direction D1. In some embodiments, the second direction D2 may also be defined as not being orthogonal to the first direction D1. The supporting plate 20 carries the base plate 10 and serves to protect a circuit (not shown) on the first surface 100 of the base plate 10.

Then, a first circuit layer 11 is formed on the second surface 102 of the base plate 10. In the embodiment, the first circuit layer 11 has a top surface 110 facing away from the base plate, and includes a first circuit 112 and a second circuit 114. A top surface 110 of the first circuit layer 11 has a first height H1. In the embodiment, the first circuit layer 11 is formed from copper (Cu), but the present disclosure is not limited thereto. In some embodiments. The first circuit layer 11 may also be formed from Ag, Ni, Au, Pd, any other suitable material, or combinations thereof.

Figure 2:
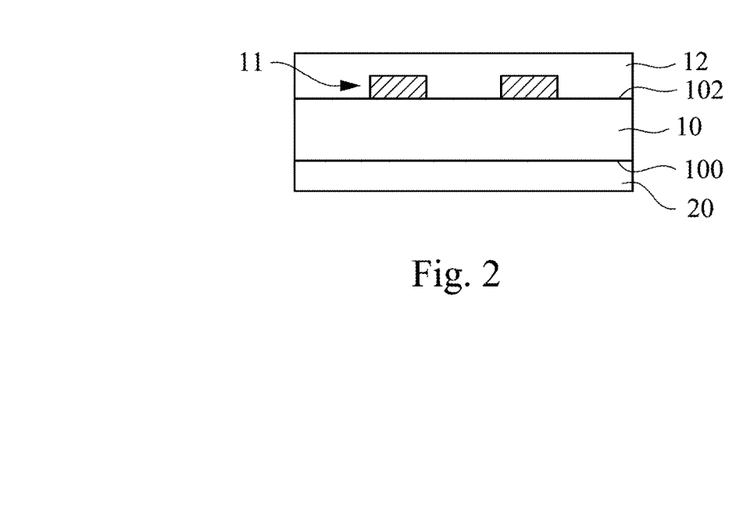

As shown in FIG. 2, a first dielectric material 12 is formed on the second surface 102 of the base plate 10, such that the first dielectric material 12 covers the first circuit layer 11, and the first circuit layer 11 is embedded in the first dielectric material 12 by pressing. For example, a method for forming the first dielectric material 12 on the base plate 10 includes a roller pressing process or a thermal pressing process, but the present disclosure is not limited thereto.

In the embodiment, a Young's modulus of the first dielectric material 12 is greater than a Young's modulus of the base plate 10. A coefficient of thermal expansion (CTE) of the first dielectric material 12 is smaller than a coefficient of thermal expansion of the base plate 10. In some embodiments, the first dielectric material 12 is formed from polymer material. In some other embodiments, the first dielectric material 12 is formed from glass fiber. In the embodiment, the first dielectric material 12 is formed from epoxy. The first dielectric material 12 is doped with at least one inorganic material, and the inorganic material includes SiO, $SiO_2$, $Al_2O_3$, or combinations thereof.

Figure 3:
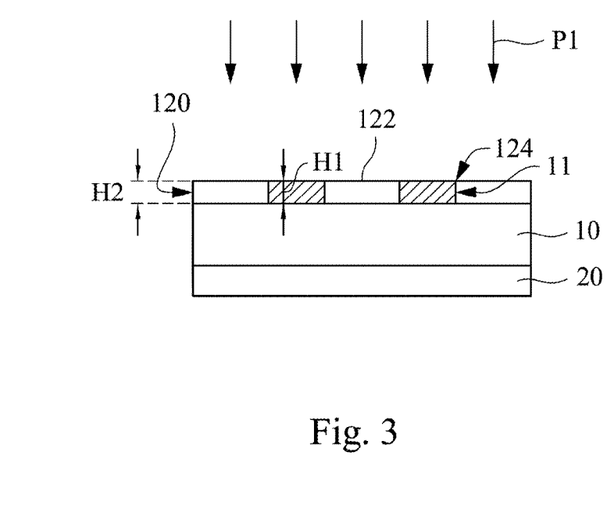

As shown in FIG. 3, after the first dielectric material 12 (shown in FIG. 2) is formed on the base plate 10, a portion of the first dielectric material 12 is removed until the first circuit layer 11 is exposed and first openings 124 are formed simultaneously to form the first dielectric layer 120. That is, the first circuit layer 11 is embedded in the first dielectric layer 120 and is exposed from the openings 124 of the first dielectric layer 120. As such, the first dielectric layer 120 has a top surface 122 facing away from the base plate 10. The top surface 122 of the first dielectric layer 120 has a second height H2 relative to the base plate 10.

In the embodiment, the operation of removing the portion of the first dielectric material 12 (as shown in FIG. 2) is performed by a grinding process P1. By the grinding process P1, the top surface 122 of the first dielectric layer 120 is substantially coplanar with the top surface 110 of the first circuit layer 11. That is, the second height H2 of the top surface 122 of the first dielectric layer 120 is substantially equal to the first height H1 of the top surface 110 of the first circuit layer 11. As such, in the subsequent process, the first dielectric layer 120 is able to withstand external environment pressure and temperature without warping, thereby maintaining a flatness of an entirety of the circuit board 1. Therefore, the first dielectric layer 120 may prevent the first dielectric layer 120 from wrapping, and prevent subsequent components formed on the first dielectric layer 120 from being damaged due to inaccurate positioning on the base plate 10, thereby improving the yield of the circuit board 1.

In some embodiments, the operation of removing the portion of the first dielectric material 12 may also be performed by a chemical mechanical planarization (CMP) process. In some embodiments, the grinding process P1 and the CMP process may be applied successively to remove the portion of the first dielectric material 12 (as shown in FIG. 2). For example, the first dielectric material 12 may be subjected to the grinding process P1 until a height of a top surface of the remaining first dielectric material 12 relative to the base plate 10 is slightly greater than the second height H2. Then, the remaining first dielectric material 12 is subjected to the CMP process until a height of the top surface of the remaining first dielectric material 12 relative to the base plate 10 is substantially equal to the second height H2. Since the CMP process has a higher precision than the grinding process P1 for removing the first dielectric material 12, the present disclosure is able to reduce the process time by using the grinding process P1 and to prevent the first dielectric layer 120 from being damaged by using the CMP process to remove the portion of the first dielectric material 12.

Figure 4:
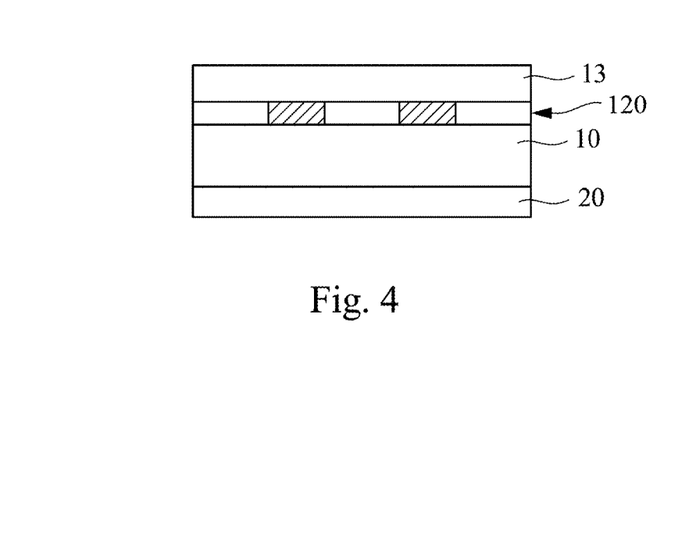

As shown in FIG. 4, after the first dielectric layer 120 is formed on the base plate 10, the second dielectric material 13 is bonded to the first dielectric layer 120 by pressing. In the embodiment, a method for forming the second dielectric material 13 on the first dielectric layer 1200 includes a roller pressing process or a thermal pressing process, but the present disclosure is not limited thereto. In some embodiments, the second dielectric material 13 may also be formed on the first dielectric layer 120 by a coating process which may be combined with a thermal leveling process.

In the embodiment, a Young's modulus of the first dielectric layer 120 is greater than a Young's modulus of the second dielectric material 13. A coefficient of thermal expansion (CTE) of the first dielectric layer 120 is smaller than a coefficient of thermal expansion of the second dielectric material 13. In the embodiment, the second dielectric material 13 is formed from a photoimageable dielectric (PID) material, and mechanisms of the photoimageable dielectric are not limited to a positive or negative mechanism. For example, the first dielectric layer 12 of the present disclosure is formed from material includes an epoxy resin film, an Ajinomoto Build-up Film (ABF), prepreg (PP), or any other suitable material. In the embodiment, a method of bonding the second dielectric material 13 to the first dielectric layer 120 by pressing includes a vacuum pressing process, but the present disclosure is not limited thereto. Furthermore, a tool used for the vacuum pressing process of the present disclosure may include a batch single stage pressing tool or a batch multi-stage pressing tool.

Figure 5:
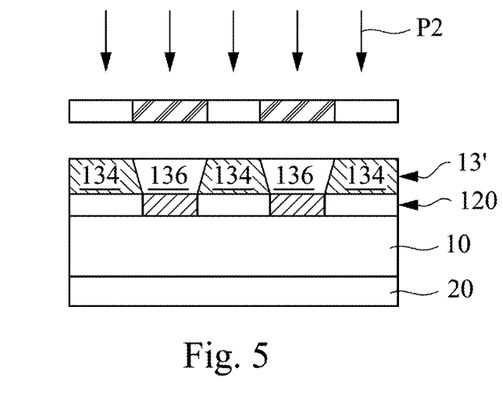

As shown in FIG. 5, after the second dielectric material 13 is bonded to the first dielectric layer 120 by pressing, the second dielectric material 13 is patterned. Furthermore, an exposure process P2 is performed on the second dielectric material 13, so as to form exposure regions 134 and non-exposure regions 136 on the exposed second dielectric material 13'. For example, a tool used for the exposure process P2 may include a direct imaging tool (DI), a laser direct imaging tool (LDI), a stepper tool, a contacting exposure tool, or any other suitable tool.

Figure 6:
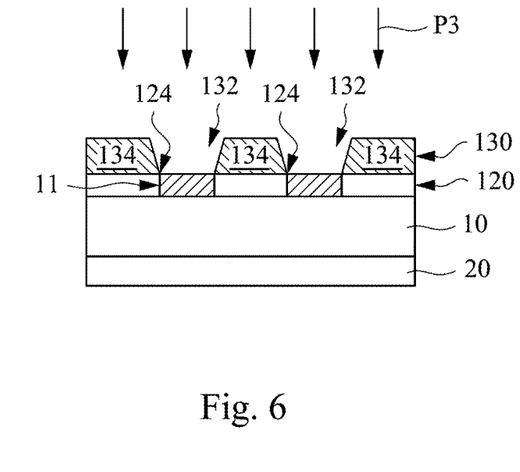

As shown in FIG. 6, after the exposure process P2 is performed on the second dielectric material 13, a developing process P3 is performed on the exposed second dielectric material 13', so as to form a patterned second dielectric material, i.e. a second dielectric layer 130, on the first dielectric layer 120. Furthermore, the exposed second dielectric material 13' in the non-exposure regions 136 (as shown in FIG. 5) is removed by the developing process P3, and the exposed second dielectric material 13' in the exposure regions 134 is remained, thereby forming the second dielectric layer 130 and plural through holes 132 therein. The first circuit layer 11 is exposed through the through holes 132 of the second dielectric layer 130. That is, the second dielectric layer 130 is disposed on the first dielectric layer and has through holes 132. The through holes 132 of the second dielectric layer 130 are communicated with the first openings 124 of the first dielectric layer 120 respectively.

Then, after the developing process P3 is finished, a curing process is performed on the second dielectric layer 130 to cure the second dielectric layer 130. In some embodiments, the curing process may include thermal curing process, light curing process, any other suitable process, or combinations thereof.

Figure 7:
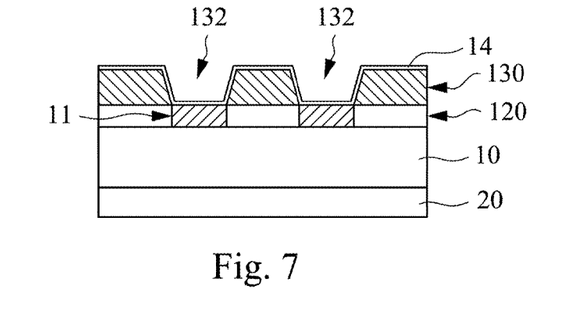

As shown in FIG. 7, after the second dielectric layer 130 is formed on the first dielectric layer 120, a portion of a second circuit layer 14 is conformally formed on the second dielectric layer 130. That is, different portions of the second circuit layer 14 have the same thickness. Furthermore, the second circuit layer 130 is located in the through holes 132 of the second dielectric layer 130 and is in contact with the first circuit layer 11. The second circuit layer 14 is able to act as a seed layer for the conductive contacts 170 (shown in FIG. 11) formed in a subsequent process. In the embodiment, a method for forming the second circuit layer 14 is used by a full board metallization process. In some embodiments, a method for forming the second dielectric layer 14 includes an electroplating process, a physical vapor deposition (PVD) process, or any other suitable process.

Figure 8:
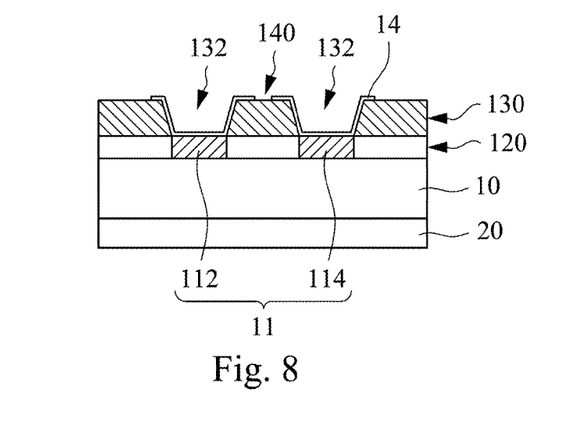

As shown in FIG. 8, the second circuit layer 14 is patterned to at least form an second opening 140 located outside of the through holes 132 of the second dielectric layer 130, in which the opening 140 exposes the second dielectric layer 130. The second opening 140 of the patterned second circuit layer 14 is located between the first circuit 112 and the second circuit 114. In the embodiment, a method for patterning the second circuit layer includes an etching process.

Figure 9:
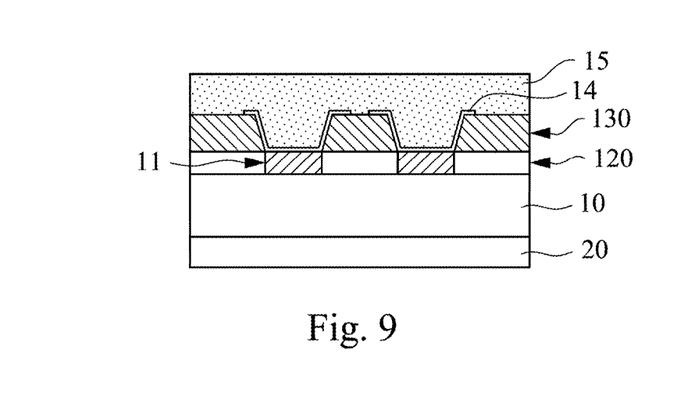

As shown in FIG. 9, after the patterned second circuit layer 14 is formed, an insulative material 15 is formed on the base plate 10 and covers the second dielectric layer 130 and the patterned second circuit layer 14. In the embodiment, the insulative material 15 is formed from a photoimageable dielectric material, and mechanisms of the photoimageable dielectric are not limited to a positive or negative mechanism. In some embodiments, the insulative material 15 is formed from an elastic material.

Figure 10:
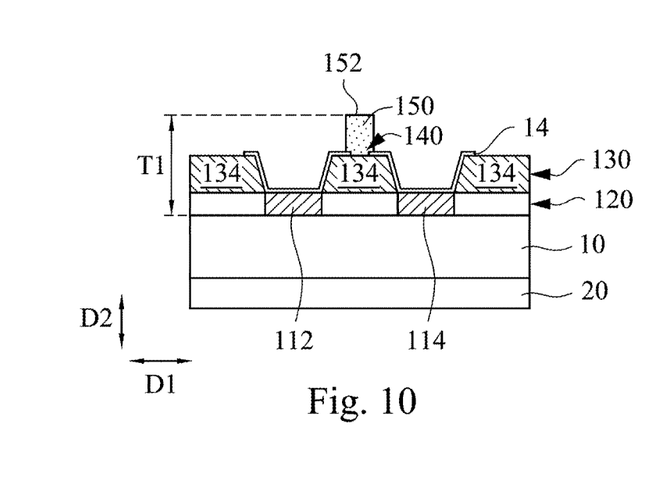

As shown in FIG. 10, after the insulative material 15 is formed on the base plate 10, the insulative material 15 is patterned to form a spacer 150 on the exposure region 134 between the first circuit 112 and the second circuit 114. Specifically, in the first direction D1, the insulative material 15 (as shown in FIG. 9) located between the first circuit 112 and the second circuit 114 is remained, and the insulative material 15 above and outside the first circuit 112 and the second circuit 114 is removed. For example, a method for removing the portion of the insulative material 15 includes the exposure process P2 and the developing process P3 (reference is made to FIG. 5), in which the related detailed descriptions may refer to the foregoing paragraphs, and are not discussed again herein, but the present disclosure is not limited thereto.

Specifically, the spacer 150 is connected to the exposure region 134 of the second dielectric layer 130 through the second opening 140 of the second circuit layer 14, and is electrically isolated to the second circuit layer 14 on the first circuit 112 and the second circuit 114. Furthermore, the spacer 150 covers a portion of the second circuit layer 14, thereby fixing the second circuit layer 14 to the second dielectric layer 140 to assist positioning the conductive contact 170 (shown in FIG. 11) subsequently formed on the second circuit layer 14. In the embodiment, the spacer 150 has a top surface 152 facing away from the base plate 10. The top surface 152 of the spacer 150 is spaced apart from the base plate 10 by a first distance T1.

Figure 11:
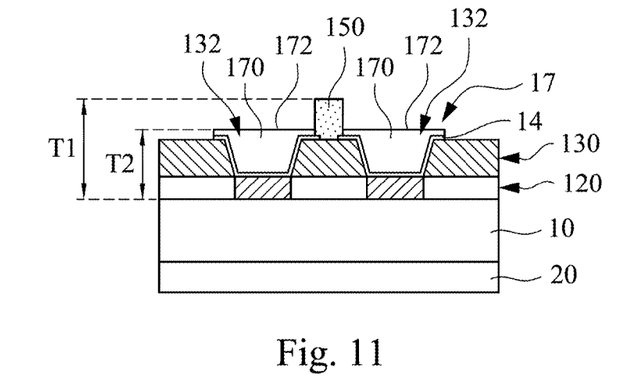

As shown in FIG. 11, after the spacer 150 is formed on the second dielectric layer 130, plural conductive contacts 170 are formed in the through holes 132 of the second dielectric layer 130 respectively. Specifically, a conductive material 17 is formed in each of the through holes 132 of the second dielectric layer 130, so as to form the conductive contacts 170 at least to the point at which the conductive material 17 contacts the spacer 150. The spacer 150 electrically isolates the conductive contacts 170. The conductive contact 170 has a top surface 172 facing away from the base plate 10. The top surface 172 of the conductive contact 170 is spaced apart from the base plate 10 by a second distance T2. The second distance T2 is less than the first distance T1. As such, the spacer 150 is able to prevent the conductive contacts from contacting each other, thereby enabling a light emitting device 18 (as shown in FIG. 18) formed subsequently to operate normally. Furthermore, because the spacer 150 of the embodiment is an elastic body, when the light emitting device 18 is disposed on the conductive contacts 170, the spacer 150 is able to absorb energy generated by collision as a buffer structure, so as to prevent the light emitting device 18 from being damaged during the collision in a manufacturing process.

Figure 12:
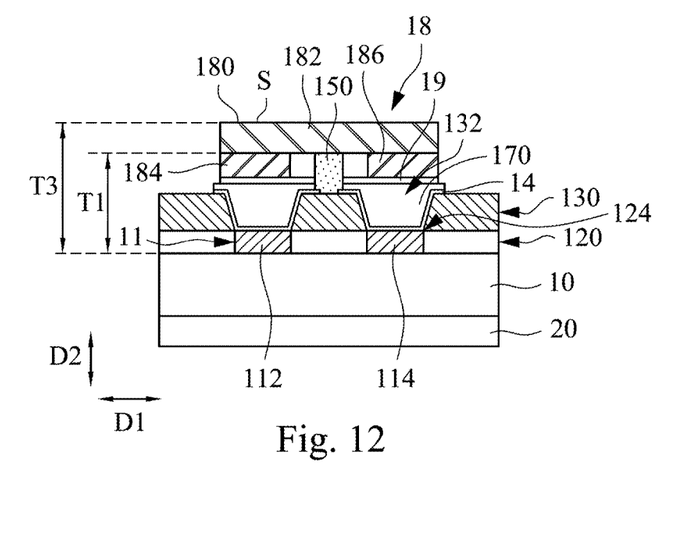

As shown in FIG. 12, after the conductive contacts 170 are formed, the light emitting device 18 is electrically connected to the first circuit layer 11 along with the conductive layer 19, such that the light emitting device 18 emits light. The spacer 150 is located between the first dielectric layer 120 and the light emitting device 18 in the second direction D2. The light emitting device 18 includes a light emitting unit 182, a first electrode 184, and a second electrode 186, in which the light emitting unit 182 has a light emitting surface S and includes a first type semiconductor layer (not shown), a second type semiconductor layer (not shown), and an active layer (not shown). For example, the first electrode 184 may be a P electrode used to connect a positive voltage, and the second electrode 186 may be an N electrode used to connect a negative voltage, but the present disclosure is not limited thereto.

Specifically, the first electrode 184 and the second electrode 186 of the light emitting device are respective electrically connected to the second circuit layer 14 through the conductive conducts 170 formed in the through holes 132 of the second dielectric layer 130, and further respective electrically connected to the first circuit layer 11 through the openings 124 of the first dielectric layer 120. The light emitting device 18 of the embodiment has a top surface 180 facing away from the base plate 10. The top surface 180 of the light emitting device 18 is spaced apart from the base plate 10 by a third distance T3.

In the embodiment, a contour of a vertical projection of the second circuit layer 14 projected on the base plate 10 covers an entirety of a vertical projection of the light emitting element 18 projected on the base plate 10. As such, the second circuit layer 14 is able to ensure that a range of growth of the conductive contacts 170 may cover the light emitting device 18. Therefore, when the light emitting device 18 is disposed on the conductive contacts 170, the first electrode 184 and the second electrode 186 are able to easily align with and electrically connect to the first circuit layer 11, so as to ensure a light emitting efficiency of the light emitting device 18 on the circuit board 1.

In the embodiment, the conductive layer 19 is formed from an anisotropic conductive material, but the present disclosure is not limited thereto. A method for forming the conductive layer 19 includes a screen printing process, an inkjet process, or any other suitable process, but the present disclosure is not limited thereto.

In the embodiment, the light emitting device 18 is light emitting diode. The light emitting device 18 is electrically connected to the first circuit 112 and the second circuit 114 of the first circuit layer 11 by performing a flip chip process.

In the embodiment, top surfaces of the first electrode 184 and the second electrode 186 facing away from the base plate 10 has a distance relative to the base plate 10, in which the distance is substantially equal to the first distance T1. In other words, a bottom surface of the light emitting unit 182 facing the base plate 10 is substantially equal to the first distance T1.

Figure 13:
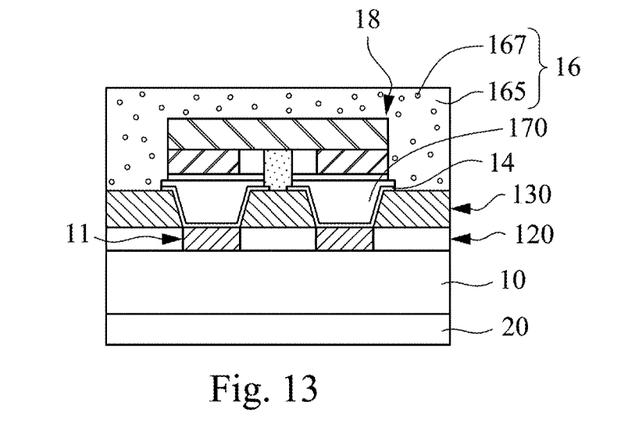

As shown in FIG. 13, after the light emitting device 18 is electrically connected to the first circuit layer 11, a light absorbing material 16 is formed on the base plate 10, and covers the light emitting device 18, the conductive contacts, the patterned second circuit layer 14, and the second dielectric layer 130. The light absorbing material 16 includes a substrate 164 and light absorbing particles 167. The light absorbing particles 167 of the light absorbing material 16 are uniformly distributed in the substrate 165.

In the embodiment, the substrate 165 of the light absorbing material 16 is formed from a photoimageable dielectric material, and mechanisms of the photoimageable dielectric are not limited to a positive or negative mechanism. In some embodiments, the substrate 165 may include polymer. For example, the substrate 165 may be formed from polyimide (PI), polyvinyl alcohol (PVA), or any other suitable material. In some other embodiments, the substrate 165 may be formed from acrylate, but the present disclosure is not limited thereto. In some embodiments, the light absorbing particles 167 include carbon, black dye, or any other suitable material.

In some embodiment, a method for forming the light absorbing material includes spin coating.

Figure 14:
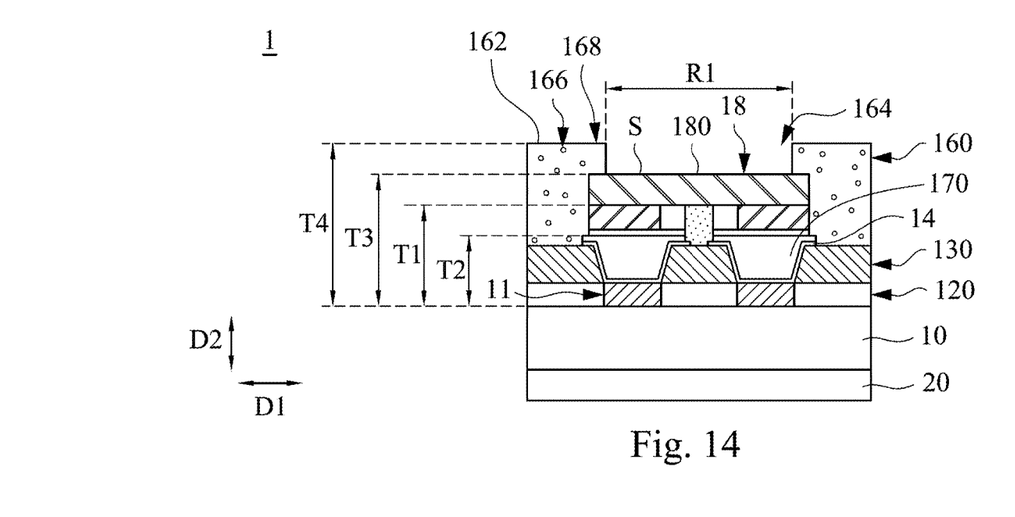

As shown in FIG. 14, after the light absorbing material 16 (as shown in FIG. 13) is formed on the base plate 10, the light absorbing material 16 is patterned to form a light absorbing structure 160 on the light emitting device 18, conductive contacts 170, and the patterned second circuit layer 14, so as to complete the circuit board 1 of the embodiment. Specifically, in the first direction D1, the light absorbing material 16 surrounding the light emitting device 18 is remained, and at least one portion of the light absorbing material 16 above the light emitting device 18 is removed to form a third opening 164 and a light absorbing structure 169 surrounding the third opening 164. In some embodiments, a number of the third opening 164 may be plural. Furthermore, the light absorbing structure 160 is disposed on the first dielectric layer 120 and the second dielectric layer 130, and protrudes from the base plate 10, and is used to absorb the light emitting from the light emitting device 18. In some embodiments, the light absorbing structure 160 is bonded to the light emitting device 18. In the embodiment, the light emitting device 18 is exposed by the light absorbing structure 160 through the third opening 164.

In the embodiment, the light absorbing structure 160 has a top surface 162 facing away from the base plate 10. The top surface 162 of the light absorbing structure 160 is spaced apart from the base plate 10 by a fourth distance T4. The fourth distance T4 is greater than the first distance T1, the second distance T2, and the third distance T3.

In the embodiment, the light absorbing structure 160 includes a columnar portion 166 and a protruding portion 168. The columnar portion 166 of the light absorbing structure 160 is disposed on the second dielectric layer 130 and surrounds the light emitting device 18. The columnar portion 166 partially covers the conductive contacts 170 and extends away from the base plate 10 along the second direction D2. Therefore, the columnar portion 166 is able to absorb light emitted laterally by the light emitting device 18, thereby preventing the circuit board 1 from having the problem of light leakage or preventing light emitted from different light emitting devices 18 on the circuit board 1 from mixing with each other. Furthermore, since the columnar portion 166 partially covers the conductive contacts 170, the columnar portion 166 is able to fix the conductive contacts 170 to the second dielectric layer 130. Hence, when the conductive contacts 170 are thin circuit and their bonding force with the second dielectric layer 130 is insufficient, the columnar portion 166 may help to position the conductive contacts 170 on the second dielectric layer 130, so as to prevent the conductive contacts 170 from separating from the second dielectric layer 130.

Furthermore, the protruding portion 168 of the light absorbing structure 160 protrudes from the columnar portion 166 to the light emitting device 18 and partially covers the top surface 180 of the light emitting device 18. In addition, the protruding portion 168 extends from an outer edge of the top surface 180 of the light emitting device 18 toward an inner side of the top surface along the first direction D1. Therefore, the protruding portion 168 is able to absorb a portion of light emitted from the light emitting device 18, so as to control a light emitting area R1 of the light emitting device. For example, different colors of the light emitting diodes have different luminous efficiencies. Therefore, if the light emitting surfaces S of different light emitting diodes have the same area, the color performance of the display (not shown) on the circuit board 1 will be affected.

Therefore, in the embodiment, the light emitting areas R1 of the different light emitting devices 18 are controlled by the protrusion portions 168, such that the light emitting devices 18 having different colors are able to have different light emitting areas R1, thereby improving the inconsistency of the light emitting efficiency of pixels of different colors.

In some embodiments, the fourth distance T4 is substantially equal to the third distance T3. That is, in the second direction D2, the light absorbing material 16 located above the light emitting device 18 is completely removed to expose the entire top surface 180 of the light emitting device 18.

In some embodiments, a method for removing the portion of the light absorbing material 16 includes the exposure process P2 and the developing process P3 (reference is made to FIG. 5), in which the related detailed descriptions may refer to the foregoing paragraphs, and are not discussed again herein, but the present disclosure is not limited thereto.

According to the foregoing embodiments of the disclosure, it can be known that, the first dielectric layer is able to withstand external environment pressure and temperature without warping, thereby maintaining a flatness of an entirety of the circuit board. Therefore, the first dielectric layer may prevent the first dielectric layer from wrapping and prevent subsequent components formed on the first dielectric layer from being damaged due to inaccurate positioning on the base plate, thereby improving the yield of the circuit board.

In addition, the spacer is able to prevent the conductive contacts from contacting each other, thereby enabling a light emitting device formed subsequently to operate normally. Furthermore, because the spacer of the embodiment is an elastic body, when the light emitting device is disposed on the conductive contacts, the spacer is able to absorb energy generated by collision as a buffer structure, so as to prevent the light emitting device from being damaged during the collision in a manufacturing process.

Moreover, in the embodiment, the light absorbing structure surrounds the light emitting device and extends away from the base plate along the second direction. Therefore, the light absorbing structure is able to absorb light emitted laterally by the light emitting device, thereby preventing the circuit board from having the problem of light leakage or preventing light emitted from different light emitting devices on the circuit board from mixing with each other.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A circuit board, comprising:
   a base plate;
   a first circuit layer disposed on the base plate;
   a first dielectric layer disposed on the base plate and having a plurality of openings, wherein the first circuit layer is embedded in the first dielectric layer and is exposed from the openings, the base plate and the first dielectric layer have an interface formed therebetween, the first dielectric layer is made of a material different from that of the base plate, and a Young's modulus of the first dielectric layer is greater than a Young's modulus of the base plate;
   a light emitting element electrically connected to the first circuit layer through the openings; and
   a light absorbing structure disposed on the first dielectric layer, protruding away from the base plate, and located adjacent to the light emitting element.

2. The circuit board of claim 1, wherein the first dielectric layer is doped with at least one inorganic material.

3. The circuit board of claim 2, wherein the inorganic material comprises SiO, $SiO_2$, $Al_2O_3$, or combinations thereof.

4. The circuit board of claim 1, wherein a top surface of the first dielectric layer facing away from the base plate is coplanar with a top surface of the first circuit layer facing away from the base plate.

5. The circuit board of claim 1, further comprising a second dielectric layer disposed on the first dielectric layer and having a plurality of through holes, wherein the through holes are respectively communicated with the openings, the light emitting element is electrically connected to the first circuit layer through the opening and the through holes, and the Young's modulus of the first dielectric layer is greater than a Young's modulus of the second dielectric layer.

6. The circuit board of claim 5, further comprising a second circuit layer partially that is disposed on the second dielectric layer conformally, located in the through holes, and in contact with the first circuit layer, wherein the light emitting element is electrically connected to the second circuit layer through the through holes.

7. The circuit board of claim 6, wherein a contour of a vertical projection of the second circuit layer projected on the base plate covers an entirety of a vertical projection of the light emitting element projected on the base plate.

8. The circuit board of claim 1, further comprising a spacer located between the first dielectric layer and the light emitting element in a direction perpendicular to the base plate.

9. The circuit board of claim 8, further comprising a plurality of conductive contacts located in the through holes respectively, wherein a top surface of the spacer and the base plate are spaced apart by a first distance, top surfaces of the conductive contacts are spaced apart from the base plate by a second distance, and the second distance is less than the first distance.

10. The circuit board of claim 1, wherein a top surface of the light emitting element and the base plate are spaced apart by a first distance, a top surface of the light absorbing structure and the base plate are spaced apart by a second distance, and the second distance is greater than the first distance.

11. A method for manufacturing a circuit board, the method comprising:
    forming a first circuit layer on a base plate;
    forming a first dielectric layer on the base plate, such that the first circuit layer is embedded in the first dielectric layer, wherein the first dielectric layer has a plurality of first openings, the first circuit layer is exposed from the first openings, the base plate and the first dielectric layer have an interface formed therebetween, the first dielectric layer is made of a material different from that of the base plate, and a Young's modulus of the first dielectric layer is greater than a Young's modulus of the base plate;
    forming a second dielectric material on the first dielectric layer;
    patterning the second dielectric material to form a plurality of through holes, such that the first circuit layer is exposed from the through holes;
    forming a spacer on the patterned second dielectric material; and
    forming a conductive material in the through holes at least until the conductive material is in contact with the spacer to form a plurality of conductive contacts, wherein the light emitting element is electrically connected to the first circuit layer through the through holes and the conductive contacts.

12. The method of claim 11, wherein the forming the first dielectric layer on the base plate is performed by pressing, such that the first circuit layer is embedded in the first dielectric layer.

13. The method of claim 11, wherein the forming the first dielectric layer on the base plate comprises:
    forming a first dielectric material on the base plate, such that the first dielectric material covers the first circuit layer; and
    removing a portion of the first dielectric material until the first circuit layer is exposed from the first openings.

14. The method of claim 13, wherein the removing the portion of the first dielectric material is performed by a grinding process.

15. The method of claim 13, wherein the removing the portion of the dielectric material until the first circuit layer is exposed from the openings further makes a top surface of the first dielectric layer be coplanar with a top surface of the first circuit layer.

16. The method of claim 11, wherein the light emitting element is a light emitting diode, and the electrically connecting the light emitting element to the exposed first circuit layer is electrically bonding the light emitting diode to the first circuit layer by performing a flip chip process.

17. The method of claim 11, further comprising:
    forming a second circuit layer on the patterned second dielectric material conformally before the forming the spacer; and
    patterning the second circuit layer at least to form a second opening located outside the through holes and exposing the patterned second dielectric layer, wherein the spacer is connected to the patterned second dielectric material through the second opening and is electrically isolated from the conductive contacts.

* * * * *